United States Patent
Legagneux et al.

(10) Patent No.: US 7,491,269 B2
(45) Date of Patent: *Feb. 17, 2009

(54) METHOD FOR CATALYTIC GROWTH OF NANOTUBES OR NANOFIBERS COMPRISING A NISI ALLOY DIFFUSION BARRIER

(75) Inventors: Pierre Legagneux, St Denis (FR); Didier Pribat, Sevres (FR); Yannig Nedellec, Montpellier (FR)

(73) Assignee: Thales (FR)

( * ) Notice: Subject to any disclaimer, the term of this patent is extended or adjusted under 35 U.S.C. 154(b) by 211 days.

This patent is subject to a terminal disclaimer.

(21) Appl. No.: 10/497,079

(22) PCT Filed: Dec. 3, 2002

(86) PCT No.: PCT/FR02/04155

§ 371 (c)(1),
(2), (4) Date: Jun. 9, 2005

(87) PCT Pub. No.: WO03/048040

PCT Pub. Date: Jun. 12, 2003

(65) Prior Publication Data

US 2005/0235906 A1    Oct. 27, 2005

(30) Foreign Application Priority Data

Dec. 4, 2001  (FR) .................................. 01 15647

(51) Int. Cl.
    *C30B 29/62*   (2006.01)
(52) U.S. Cl. .............. 117/94; 117/95; 117/96; 117/89; 117/105

(58) Field of Classification Search .............. 117/94, 117/95, 96, 89, 105
See application file for complete search history.

(56) References Cited

U.S. PATENT DOCUMENTS 4,540,452 A    9/1985   Croset
(Continued)

FOREIGN PATENT DOCUMENTS

EP          1046613        10/2000
(Continued)

OTHER PUBLICATIONS

Biro L P et al: "Selective nucleation and growth of carbon nanotubes at the CoSi/sub 2//Si interface" Applied Physics Letters, Feb. 7, 2000.
(Continued)

*Primary Examiner*—Robert M Kunemund
(74) *Attorney, Agent, or Firm*—Lowe Hauptman Ham & Berner, LLP

(57) ABSTRACT

The invention relates to a process for the growth of nanotubes or nanofibers on a substrate comprising at least an upper layer made of a first material, wherein: the formation, on the surface of the upper layer, of a barrier layer made of an alloy of the first material and of a second material, said alloy being stable at a first temperature; the formation of spots of catalyst that are made of the second material, on the surface of the alloy layer; and the growth of nanotubes or nanofibers at a second temperature below said first temperature. The alloy layer allows effective growth of nanotubes/nanofibers from catalyst spots on the surface of said alloy layer. This is because the alloy layer constitutes a diffusion barrier preventing the catalyst from diffusing into the growth substrate, which barrier is stable at the catalytic nanotube/nanofiber growth temperature.

20 Claims, 3 Drawing Sheets

U.S. PATENT DOCUMENTS

| | | |
|---|---|---|
| 4,952,526 A | 8/1990 | Pribat |
| 4,999,314 A | 3/1991 | Pribat |
| 5,053,833 A | 10/1991 | Pribat |
| 5,090,932 A | 2/1992 | Dieumegard |
| 5,262,348 A | 11/1993 | Pribat |
| 5,273,929 A | 12/1993 | Hirtz et al. |
| 5,294,564 A | 3/1994 | Karapiperis |
| 5,314,569 A | 5/1994 | Pribat |
| 5,356,510 A | 10/1994 | Pribat |
| 5,360,754 A | 11/1994 | Pribat |
| 5,581,146 A | 12/1996 | Pribat |
| 6,596,187 B2 * | 7/2003 | Coll et al. .................. 216/56 |
| 2003/0052585 A1 * | 3/2003 | Guillorn et al. ............ 313/311 |
| 2004/0240157 A1 * | 12/2004 | Legagneux et al. ......... 361/516 |
| 2006/0071344 A1 * | 4/2006 | Nihei ........................ 257/774 |
| 2006/0076867 A1 * | 4/2006 | Guillorn et al. ............ 313/309 |

FOREIGN PATENT DOCUMENTS

| | | |
|---|---|---|
| EP | 1059266 | 12/2000 |
| EP | 1061043 | 12/2000 |
| EP | 1129990 | 9/2001 |

OTHER PUBLICATIONS

Selective nucleation and growth of carbon nanotubes at the CoSi2/Si interface Applied Physics Letter, Feb. 7, 2000.

* cited by examiner

METHOD FOR CATALYTIC GROWTH OF NANOTUBES OR NANOFIBERS COMPRISING A NISI ALLOY DIFFUSION BARRIER

CROSS-REFERENCE TO RELATED APPLICATIONS

The present Application is based on International Application No. PCT/FR02/04155, filed on Dec. 3, 2002, which in turn corresponds to FR 01/15647 filed on Dec. 4, 2001, and priority is hereby claimed under 35 USC §119 based on these applications. Each of these applications are hereby incorporated by reference in their entirety into the present application.

FIELD OF THE INVENTION

The field of the invention is that of nanotubes or nanofibers that may be of the carbon, silicon or boron type or made of any other alloy based on at least one of these components (for example SiC) and possibly containing nitrogen (SiN, BN, SiCN). Typically, these nanotubes or nanofibers have diameters ranging from a few nanometers to a few hundred nanometers over several microns in height.

DESCRIPTION OF RELATED ART

They are particularly beneficial for nanotechnology, composites, battery electrodes, energy storage, nanoelectronics, and field-emission devices.

As regards nanotechnology, the applications are in design and molecular engineering, nanotips (for metrology), actuators, robots, sensors, and therefore MEMS (micro-electromechanical systems).

As regards energy storage, the applications are for fuel cells, which use the hydrogen storage properties of nanotubes, and also supercapacitors.

Nanoelectronics includes conventional electronic components (diodes, transistors, capacitors), molecular electronics, and future components in the case of future computers (carbon nanotube molecular computers).

In the case of field-emission devices, the applications are cold electron sources for electron microscopy, analytical equipment using an electron beam, nanolithography, electron tubes, ion motors and flat display devices.

The growth of nanotubes/nanofibers on a substrate or a support is carried out on catalyst aggregates of very small size (<100 nm) at a temperature generally above 500° C. and possibly exceeding 1000° C.

Conventionally, nanotubes or nanofibers are produced by growth from small catalyst spots that may be defined by lithography. FIG. 1 illustrates such a growth. Starting from a substrate 1, submicron apertures (preferably around 100 nm in size) are made in a resist 2 (FIG. 1a). Next, catalyst is deposited as a thin film 3, with a thickness of less than about 10 nm (FIG. 1b). After dissolving the resist (FIG. 1c), catalyst spots having a diameter equivalent to the diameter of the apertures in the resist are obtained. The process then continues with the growth of nanotubes or nanofibers (FIG. 1c).

The methods of preparation are the following: electrical discharge, pyrolysis, physical methods such as laser ablation and chemical methods such as CVD (chemical vapor deposition) or PECVD (plasma-enhanced CVD).

The method that seems best suited to the field-effect cathode application is the PECVD method, which is assisted by DC plasma, RF (radiofrequency) plasma or microwave plasma. This method allows nanotubes and nanofibers to be obtained that are oriented perpendicular to the substrate.

The nanotubes or nanofibers shown in all the figures of the application are drawn schematically. In contrast to the nanofibers, the nanotubes are hollow.

For example, in the case of carbon nanotubes, the diameter of the nanotubes is close to that of the catalyst particle. Owing to the elongate shape that this particle (see FIG. 1d) made of material B (which may be C, SiC, BN, etc.) adopts, its diameter is smaller than that of the spots defined beforehand by lithography.

However, if during the step of raising the temperature of the substrate or support the catalyst aggregates diffuse into or are dissolved in the substrate or support, there will therefore be no nanotube/nanofiber growth. It is therefore of paramount importance to deposit an effective diffusion barrier prior to the depositing the catalyst. If the barrier is not very effective, the growth of nanotubes/nanofibers will be poorly controlled.

The division barriers currently used are generally silica ($SiO_2$) and titanium nitride (TiN). $SiO_2$ is an excellent barrier but it is an insulating material and therefore poorly suited in the case in which it is necessary to electrically connect the nanotubes. It should be noted that $SiO_2$ may, however, be used as a very thin film (2-4 nm) and that, in this case, the current can flow by a tunnel effect. $SiO_2$ rapidly degrades as the electrical current flows and it then loses its insulating properties. TiN is also an excellent diffusion barrier, but only for nanotube growth temperatures below 700° C. This is because above 700° C., the nitrogen constituent of the TiN undergoes exodiffusion and the material then loses its diffusion barrier properties.

In this context, the invention proposes to use novel diffusion barriers designed for catalytic nanotube and nanofiber growth and suitable for catalysts of the nickel, cobalt, iron, platinum, or yttrium type, or those made of any other alloy based on at least one of these components.

SUMMARY OF THE INVENTION

More precisely, the subject of the invention is a process for the growth of nanotubes or nanofibers on a substrate comprising at least an upper layer made of a first material, characterized in that it comprises:
the formation, on the surface of the upper layer, of a barrier layer made of an alloy of the first material and of a second material, said alloy being stable at a first temperature;
the formation of spots of catalyst that are made of the second material, on the surface of the alloy layer; and
the growth of nanotubes or nanofibers at a second temperature below said first temperature.

According to a variant of the invention, the formation of the barrier layer comprises the deposition of a layer made of the second material on the surface of the upper layer made of the first material, followed by annealing at said first temperature.

The invention thus consists in depositing a thin layer of second material constituting the catalyst on the upper layer of first material and then in annealing at a temperature greater than or equal to the nanofiber/nanotube growth temperature. Thus, an alloy stable at the annealing temperature $T_a$, and therefore at the nanotube/nanofiber growth temperature $T_g$, is formed (where $T_g < T_a$). Consequently, when catalyst spots are subsequently used, these do not react with the alloy formed beforehand and they allow effective catalytic nanotube/nanofiber growth.

According to a variant of the invention, the process includes the deposition of a catalyst layer made of the second material on the surface of the alloy layer and then the local etching of said catalyst layer so as to define the catalyst spots.

Advantageously, resist spots may be produced beforehand on the alloy layer.

According to a variant of the invention, the first material and the substrate are of identical nature.

According to another variant of the invention, the first material and the substrate are of different nature. In this case, advantageously if the upper layer of first material has a first number of atoms $N_M$, and the layer of second material has a second number of atoms $N_A$, by adjusting $N_M/N_A < x/y$ where x and y are molar fractions of the alloy $M_xA_y$, it is possible during formation of the alloy with the second material in excess (relative to the formation of the alloy) to form catalyst spots of said second material directly. In this case, it is possible to dispense with the subsequent deposition of a catalyst layer in order to form catalyst spots for the purpose of forming nanotubes/nanofibers.

Advantageously, the first material may be silicon or a metal.

When the alloy layer is obtained after a layer of second material has been deposited on the upper layer at the surface of the substrate and the whole assembly has been annealed, this alloy layer may typically have a thickness of between about ten nanometers and about one hundred nanometers.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The invention will be better understood and other advantages will become apparent on reading the description that follows and with the aid of the appended figures in which.

DETAILED DESCRIPTION OF THE INVENTION

According to the invention, the nanotube/nanofiber growth process comprises the production of a barrier layer forming a barrier with respect to a catalyst layer, necessary for growth of the nanotubes/nanofibers.

According to a variant of the invention, the process includes the production of a cobalt layer of about fifty nanometers on the surface of a silicon layer, in order to produce the $CoSi_2$ alloy.

FIG. 2 illustrates a first example of a process according to the invention, in which the substrate and the material of the upper layer are of different nature. (However, according to other variants of the invention, the substrate S may itself be made of the material M).

Figure 1A:
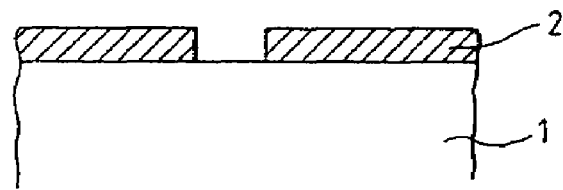
FIGS. 1a-1d illustrate the steps of a catalytic nanofiber/nanotube growth process according to the prior art.
Figure 1B:
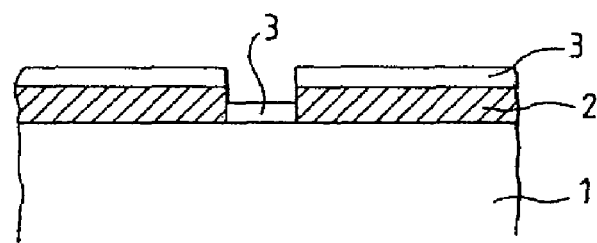
Figure 1C:
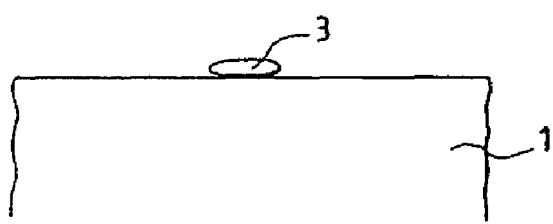
Figure 1D:
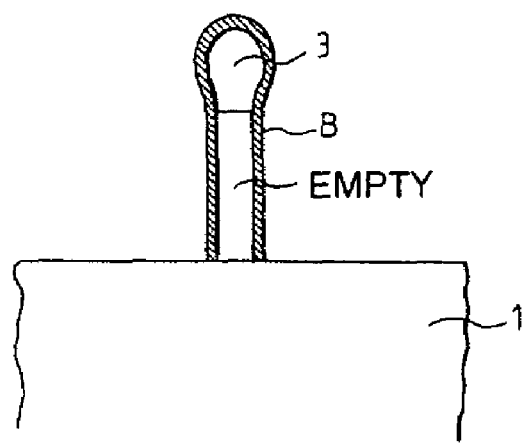
Figure 2A:
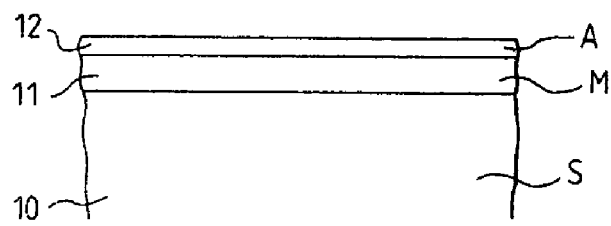
FIGS. 2a-2e illustrate the steps of an example of a nanotube/nanofiber growth process, according to the invention.

In a first step, the barrier layer is produced by predepositing a layer 12 of material A on the surface of an upper layer 11 of material M, itself on the surface of a substrate S (FIG. 2a).

Figure 2B:
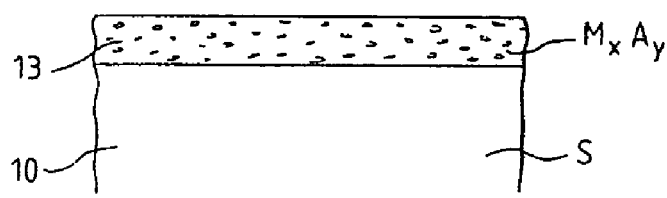

An annealing operation is then carried out at a temperature $T_a$, which allows the formation of a layer 13 of alloy $M_xA_y$ (FIG. 2b).

Figure 2C:
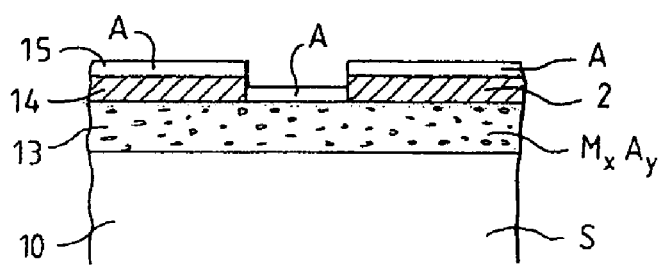
Figure 2D:
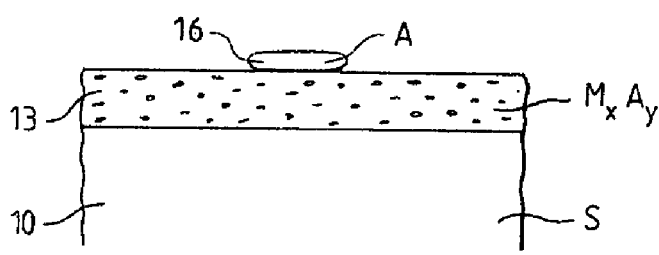
Figure 2E:
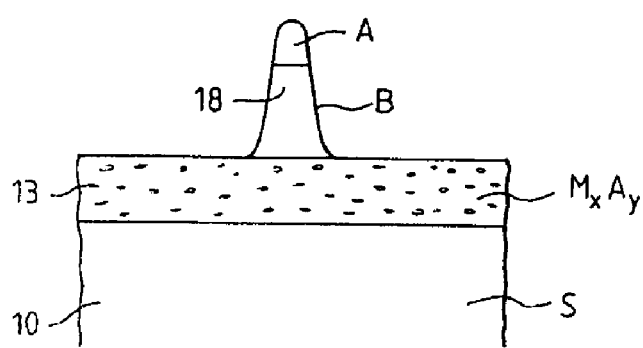

Conventionally, a layer 14 of resist 2 is then deposited, and etched. A layer 15 of catalyst material A is then deposited (FIG. 2c). After removal of the resist and excess catalyst material A (FIG. 2d), spots 16 of catalyst A are defined. The growth of the nanotubes 18 of a material B is then carried out at a temperature $T_g$ below the temperature $T_a$ (FIG. 2e), it being possible for the material B to be of the type C, SiC, BN, etc.

FIG. 3 illustrates a second example of a process according to the invention in which the judicious choice of the amounts of catalyst material and of first material allow a layer of alloy $M_xA_y$ and spots of catalyst of material A to be formed simultaneously.

As an example, it may be mentioned that a layer of silicon material M with a thickness of 185 Å and a layer of nickel material A with a thickness of 100 Å, form at 750° C., a uniform layer of alloy NiSi. A silicon defect or an excess of nickel makes it possible at the this same temperature, to form a layer of alloy NiSi with residual surface spots of Ni that can be directly used for growing nanotubes.

Figure 3A:
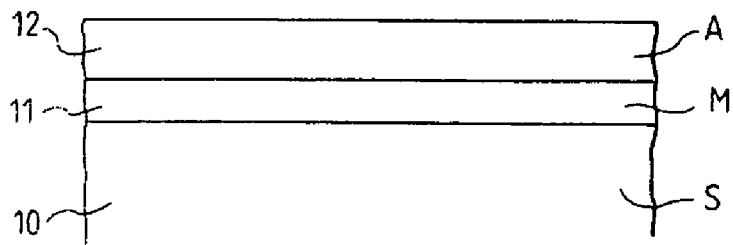
FIGS. 3a-3c illustrate the steps of a second example of a nanotube/nanofiber growth process according to the invention.

Thus, in FIG. 3a, as in the example illustrated in FIG. 2a, a layer 11 of material M is deposited on the surface of the substrate S, followed by a layer 12 of material A on the surface of the layer 11. The materials M and the substrate S must be of different nature in order to keep the material A in excess relative to the material M.

Figure 3B:
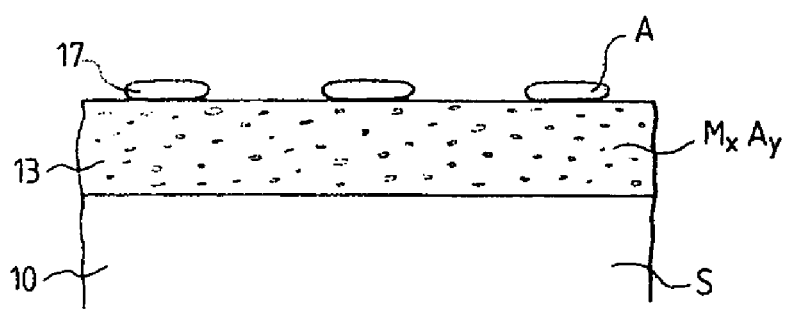

The annealing operation allows the simultaneous formation of a layer 13 of alloy $M_xA_y$ and of catalyst spots 17 corresponding to the excess of material A relative to the material M during formation of the alloy (FIG. 3b).

Figure 3C:
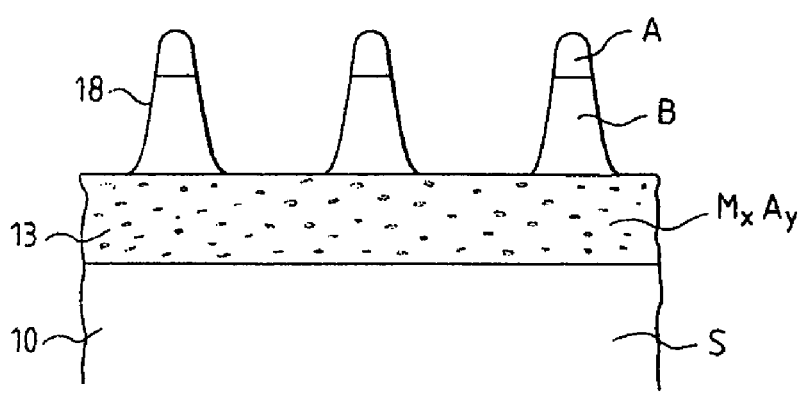

The process then continues conventionally with the growth of nanofibres/nanotubes 18 from said catalyst spots (FIG. 3c).

EXAMPLE OF A NANOTUBE GROWTH PROCESS ACCORDING TO THE INVENTION

1st Example

Material M: Silicon

Material A: Nickel

In the case of a silicon substrate or of a thin silicon layer deposited on a substrate, a thin nickel layer is deposited on the silicon. An annealing operation at 750° C. is then carried out so as to provide the compound NiSi.

The addition of platinum prevents the formation of the alloy $NiSi_2$ and therefore allows only the compound NiSi to be obtained (J. F. Liu et al., J. Appl. Phys. Vol. 90 p. 745 (2001)). The NiSi alloy then constitutes an effective diffusion barrier against nickel if the nanotube growth temperature is below 750° C. It should be noted that the localized and oriented growth of carbon nanotubes may be obtained at 700° C. (K. B. K. Teo et al., Appl. Phys. Lett. Vol. 79 p. 1534 (2001)).

It is also possible to carry out the annealing at 850° C. so as to form $NiSi_2$, which constitutes a diffusion barrier for nanotubes/nanofibers whose growth temperature is below 850° C.

A higher nanotube growth temperature (~800° C. instead of 700° C.) generally allows nanotubes to be obtained that are of better crystalline quality and therefore characterized by better electrical properties.

After producing an NiSi diffusion barrier (formed at 750° C.) or an NiSi$_2$ diffusion barrier (formed at 850° C.), it is then possible to carry out the localized and oriented growth of carbon nanotubes at a temperature of 700° C. In order to grow a single nanotube per catalyst spot, nickel spots having a diameter of the order of 100 nm and a thickness of 10 nm are defined by lithography. The growth can then be carried out at 700° C. in a CVD reactor enhanced by a DC plasma with a voltage of around 600 volts. A gas mixture containing acetylene and ammonia (with ~20% acetylene) at a pressure of about 5 torr then makes it possible to obtain oriented and selective growth of carbon nanotubes (K. B. K. Teo et al., Appl. Phys. Lett. Vol. 79 p. 1534 (2001)).

2nd Example

Material M: Silicon

Material A: Cobalt

In this second example, a cobalt layer is deposited on the surface of a silicon layer. To obtain a uniform CoSi$_2$ alloy and therefore to prevent the formation of the CoSi phase, the annealing may advantageously be carried out at a temperature above 600° C.

A thickness of around 30 to 60 nm of cobalt makes it possible to obtain, after annealing at 800° C. the CoSi$_2$ alloy (Y. J. Yoon, J. Vac. Sci. Technol. B17 p.627 (1999)). This compound formed at 800° C. then becomes an effective diffusion barrier for the cobalt catalyst, if the nanotube growth temperature is below 800° C.

3rd Example

Material M: Silicon

Material A: Iron

An FeSi$_2$ barrier layer may advantageously be formed by annealing an iron layer on the silicon surface at 700° C. This barrier layer may be used for the growth of nanotubes/nanofibers at temperatures below 700° C.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A process for the growth of nanotubes or nanofibers on a substrate comprising:
    forming an upper layer consisting of a first material;
    formatting, on the surface of the upper layer, a barrier layer consisting of an alloy of the first material and of a second material, said alloy being stable at a first temperature;
    formatting spots of catalyst consisting of the second material, on the surface of the alloy layer; and
    growing nanotubes or nanofibers using the spots of catalyst at a second temperature below said first temperature.

2. The nanotube or nanofiber growth process as claimed in claim 1, wherein the formation of the barrier layer comprises the deposition of a layer made of the second material on the surface of the upper layer made of the first material, followed by annealing at said first temperature.

3. The nanotube or nanofiber growth process as claimed in claim 1, comprising the steps of:
    depositing a catalyst layer made of the second material on the surface of the alloy layer; and
    local etching of said catalyst layer so as to define catalyst spots.

4. The nanotube or nanofiber growth process as claimed in claim 1, wherein the first material and the substrate comprise identical materials.

5. The nanotube or nanofiber growth process as claimed in claim 1, wherein the first material and the substrate comprises different materials.

6. The nanotube or nanofiber growth process as claimed in claim 5, wherein with the upper layer of first material having a first number of atoms $N_M$, and the layer (12) of second material having a second number of atoms $N_A$, the numbers $N_M$ and $N_A$ are such that $N_M/N_A < x/y$ where x and y are molar fractions of the alloy $M_xA_y$.

7. The nanotube or nanofiber growth process as claimed in claim 1, wherein the first material is silicon or a metal.

8. The nanotube or nanofiber growth process as claimed in claim 7, wherein the second material comprises one of nickel, iron or cobalt.

9. The nanotube or nanofiber growth process as claimed in claim 8, wherein the first material is silicon, the second material is nickel and the NiSi alloy is formed in the presence of platinum.

10. The nanotube or nanofiber growth process as claimed in claim 1, wherein the layer of second material has a thickness of between about 10 nanometers and 100 nanometers.

11. The nanotube or nanofiber growth process as claimed in claim 7, wherein it includes the production of a cobalt layer of about fifty nanometers on the surface of a silicon layer, in order to produce a CoSi$_2$ alloy.

12. The nanotube or nanofiber growth process as claimed in claim 7, wherein it includes the production of an FeSi$_2$ alloy.

13. The nanotube or nanofiber growth process as claimed in claim 2, comprising the steps of:
    depositing a catalyst layer made of the second material on the surface of the alloy layer; and
    local etching of said catalyst layer so as to define catalyst spots.

14. The nanotube or nanofiber growth process as claimed in claim 2, wherein the first material and the substrate comprise identical materials.

15. The nanotube or nanofiber growth process as claimed in claim 3, wherein the first material and the substrate comprise identical materials.

16. The nanotube or nanofiber growth process as claimed in claim 2, wherein the first material and the substrate comprise different materials.

17. The nanotube or nanofiber growth process as claimed in claim 3, wherein the first material and the substrate comprise different materials.

18. The nanotube or nanofiber growth process as claimed in claim 6, wherein the first material is silicon or a metal.

19. The nanotube or nanofiber growth process as claimed in claim 8, wherein it includes the production of a cobalt layer of about fifty nanometers on the surface of a silicon layer, in order to produce a CoSi$_2$ alloy.

20. The nanotube or nanofiber growth process as claimed in claim 8, wherein it includes the production of an FeSi$_2$ alloy.

* * * * *